United States Patent
Stevens et al.

(10) Patent No.: US 10,070,569 B2
(45) Date of Patent: Sep. 4, 2018

(54) METHOD FOR MANUFACTURING AN ELECTRONIC DEVICE

(71) Applicant: HzO, Inc., Draper, UT (US)

(72) Inventors: Blake L. Stevens, Morristown, NJ (US); Max E. Sorenson, Herriman, UT (US); Marc K. Chason, Schaumburg, IL (US)

(73) Assignee: HZO, Inc., Draper, UT (US)

( * ) Notice: Subject to any disclaimer, the term of this patent is extended or adjusted under 35 U.S.C. 154(b) by 0 days.

(21) Appl. No.: 15/205,696

(22) Filed: Jul. 8, 2016

(65) Prior Publication Data

US 2016/0324044 A1 Nov. 3, 2016

Related U.S. Application Data

(63) Continuation of application No. 13/736,753, filed on Jan. 8, 2013, now Pat. No. 9,426,936.
(Continued)

(51) Int. Cl.
*B23P 25/00* (2006.01)
*H05K 13/04* (2006.01)
(Continued)

(52) U.S. Cl.
CPC ....... *H05K 13/0495* (2013.01); *C08G 61/025* (2013.01); *H05K 3/28* (2013.01);
(Continued)

(58) Field of Classification Search
CPC .. H05K 3/284; H05K 2203/1322; H05K 3/28; H05K 3/341; H05K 3/285;
(Continued)

(56) References Cited

U.S. PATENT DOCUMENTS 4,335,698 A 6/1982 Stephens
5,271,953 A 12/1993 Litteral
(Continued)

FOREIGN PATENT DOCUMENTS

CN 101916037 A 12/2010
CN 102083550 A 6/2011
(Continued)

OTHER PUBLICATIONS

United States Patent and Trademark Office acting as the International Searching Authority, "International Search Report and Written Opinion," dated Mar. 19, 2013 in related PCT application No. PCT/US2013/020683.
(Continued)

*Primary Examiner* — Thiem Phan
(74) *Attorney, Agent, or Firm* — Kunzler, P.C.

(57) ABSTRACT

A system for assembling electronic devices includes at least one coating element for applying a moisture-resistant coating to surfaces of a device under assembly, or an electronic device under assembly. As components and one or more moisture-resistant coatings are added to the electronic device under assembly to form a finished electronic device, at least one surface on which the coating resides and, thus, at least a portion of the coating itself, is located internally within the finished electronic device. Methods for assembling electronic devices that include internally confined moisture-resistant coatings are also disclosed.

10 Claims, 6 Drawing Sheets

Related U.S. Application Data

(60) Provisional application No. 61/584,918, filed on Jan. 10, 2012.

(51) Int. Cl.
| | | |
|---|---|---|
| *H05K 13/00* | (2006.01) | |
| *H05K 3/28* | (2006.01) | |
| *C08G 61/02* | (2006.01) | |
| *H05K 3/34* | (2006.01) | |

(52) U.S. Cl.
CPC ............ *H05K 3/282* (2013.01); *H05K 3/341* (2013.01); *H05K 13/0023* (2013.01); *H05K 13/0465* (2013.01); *C08G 2261/312* (2013.01); *Y10T 29/49002* (2015.01); *Y10T 29/49885* (2015.01); *Y10T 29/53187* (2015.01)

(58) Field of Classification Search
CPC ........... Y10T 29/4913; Y10T 29/49885; Y10T 29/53187; Y10T 428/23986; Y10T 156/103
USPC ...... 29/458, 401.1, 460, 593, 729, 742, 829, 29/832, 841, 848; 361/752, 760, 767; 428/221, 411.1, 446, 698, 702
See application file for complete search history.

(56) References Cited

U.S. PATENT DOCUMENTS

| | | | |
|---|---|---|---|
| 5,429,682 | A | 7/1995 | Harlow, Jr. et al. |
| 5,536,282 | A | 7/1996 | Yoon et al. |
| 5,536,317 | A | 7/1996 | Crain et al. |
| 6,127,038 | A | 10/2000 | McCullough et al. |
| 6,183,615 | B1 | 2/2001 | Yasar et al. |
| 6,231,673 | B1 | 5/2001 | Maeda |
| 6,389,690 | B1 | 5/2002 | McCullough et al. |
| 6,621,157 | B1 | 9/2003 | Wirz et al. |
| 6,641,702 | B2 | 11/2003 | Shi et al. |
| 6,667,099 | B1 | 12/2003 | Greiner et al. |
| 6,919,530 | B2 | 7/2005 | Borgeson et al. |
| 7,003,477 | B2 * | 2/2006 | Zarrow ............... G06Q 10/063 700/108 |
| 7,239,227 | B1 | 7/2007 | Gupta et al. |
| 8,797,756 | B2 * | 8/2014 | Sporon-Fiedler ...... H05K 1/111 361/752 |
| 2002/0102865 | A1 | 8/2002 | Elger |
| 2002/0124394 | A1 | 9/2002 | Slechta et al. |
| 2003/0198734 | A1 | 10/2003 | Mann |
| 2005/0008848 | A1 | 1/2005 | Saccomanno et al. |
| 2006/0001700 | A1 | 1/2006 | Bertelsen et al. |
| 2006/0213441 | A1 | 9/2006 | Kobrin et al. |
| 2007/0087131 | A1 | 4/2007 | Hutchinson et al. |
| 2007/0108161 | A1 | 5/2007 | Murugesh et al. |
| 2007/0212884 | A1 | 9/2007 | Yamamoto et al. |
| 2009/0263581 | A1 | 10/2009 | Martin, III et al. |
| 2009/0263641 | A1 | 10/2009 | Martin, III et al. |
| 2009/0304549 | A1 | 12/2009 | Coulson |
| 2010/0098862 | A1 | 4/2010 | Xu et al. |
| 2010/0118503 | A1 | 5/2010 | Kellermann |
| 2010/0162954 | A1 | 7/2010 | Lei et al. |
| 2010/0203347 | A1 | 8/2010 | Coulson |
| 2010/0293812 | A1 | 11/2010 | Coulson |
| 2010/0316800 | A1 | 12/2010 | Chang et al. |
| 2011/0143021 | A1 | 6/2011 | Peterson et al. |
| 2011/0253429 | A1 | 10/2011 | Humphries et al. |
| 2011/0262740 | A1 | 10/2011 | Martin, III et al. |
| 2011/0267674 | A1 | 11/2011 | Wang et al. |
| 2012/0296032 | A1 | 11/2012 | Legein et al. |

FOREIGN PATENT DOCUMENTS

| | | |
|---|---|---|
| CN | 102150480 A | 8/2011 |
| EP | 2187718 A1 | 5/2010 |
| GB | 2353639 A | 2/2001 |
| JP | H06-102374 A | 4/1994 |
| JP | H07-211178 A | 8/1995 |
| JP | H09-307243 A | 11/1997 |
| JP | H10-93228 A | 4/1998 |
| JP | 2001249002 A | 9/2001 |
| JP | 2002514004 A | 5/2002 |
| JP | 2009517852 A | 4/2009 |
| KR | 20110107345 A | 9/2011 |
| TW | 201014483 A | 4/2010 |
| WO | 1993/016812 A1 | 9/1993 |
| WO | 1994/000868 A1 | 1/1994 |
| WO | 1999/057330 A1 | 11/1999 |
| WO | 2007/138302 A1 | 12/2007 |
| WO | 2009/151492 A2 | 12/2009 |
| WO | 2010/075462 A2 | 7/2010 |
| WO | 2010/078264 A2 | 7/2010 |
| WO | 2010/121190 A1 | 10/2010 |
| WO | 2011/089009 A1 | 7/2011 |

OTHER PUBLICATIONS

Chinese State Intellectual Property Office, "Notification of First Office Action and Search Report," dated Mar. 23, 2015 in Chinese patent application No. 201210158907.1.

European Patent Office, "Supplementary European Search Report," dated Jan. 29, 2015 in European patent application No. 13735656.4.

Office Action for Japanese Patent Application No. 2012-096417, dated Jun. 23, 2014.

Office Action for Japanese Patent Application No. 2015-015258, dated Aug. 28, 2015.

Korean Intellectual Property Office, "Notice of Preliminary Rejection," dated Nov. 28, 2014 in Korean patent application No. 10-2012-64868.

United States Patent and Trademark Office as the International Searching Authority, "International Search Report and Written Opinion," dated Jun. 10, 2013 in related international application No. PCT/US2013/033698.

European Patent Office, "Supplementary European Search Report," dated May 20, 2016 in European patent application No. 13807362.2.

United States Patent and Trademark Office as the International Searching Authority, "International Search Report and Written Opinion," dated Dec. 2, 2013 in related PCT application No. PCT/US2013/046371.

* cited by examiner

METHOD FOR MANUFACTURING AN ELECTRONIC DEVICE

CROSS-REFERENCE TO RELATED APPLICATIONS

The present application is a continuation of U.S. patent application Ser. No. 13/736,753, filed Jan. 8, 2013 and titled SYSTEMS FOR ASSEMBLING ELECTRONIC DEVICES WITH INTERNAL MOISTURE RESISTANT COATINGS, which claims priority to U.S. Provisional Patent Application No. 61/584,918, filed on Jan. 10, 2012 and titled SYSTEMS FOR ASSEMBLING ELECTRONIC DEVICES WITH INTERNAL WATER-RESISTANT COATINGS. The entire disclosure of both applications is hereby incorporated herein.

TECHNICAL FIELD

This disclosure relates generally to systems and methods for assembling electronic devices, including portable consumer electronic devices, and, more specifically, to assembly systems and methods in which electronic devices are imparted with internal moisture resistance. Even more specifically, this disclosure relates to systems and methods for forming moisture-resistant coatings on interior surfaces of electronic devices, including finished (i.e., fully assembled, etc.) electronic devices.

SUMMARY

In various aspects, a system for imparting an electronic device with internal protection in accordance with teachings of this disclosure includes one or more elements for applying protective coatings to an interior surface of each electronic device, including fully assembled, or "finished," electronic devices. Such a system may also be more simply referred to herein as a "system for assembling an electronic device" or, even more simply, as an "assembly system."

The internal protection and, thus, the protective coating, may comprise a coating that may protect an electronic device, its components or their features from potentially damaging conditions, including, but not limited to, exposure to moisture. This disclosure, in describing systems, apparatuses and processes for applying protective coatings, electronic devices that include protective coatings, and the protective coatings themselves, refers primarily to "moisture-resistant" coatings. The teachings of this disclosure are, however, also applicable to other types of protective coatings that may be useful on or in electronic devices.

The term "moisture-resistant" is used throughout this disclosure to refer to the ability of a coating to prevent exposure of a coated element or feature to moisture. A moisture-resistant coating may resist wetting or penetration by one or more types of moisture, or it may be impermeable or substantially impermeable to one or more types of moisture. A moisture-resistant coating may repel one or more types of moisture. In some embodiments, a moisture-resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.). Use of the term "moisture-resistant" to modify the term "coating" should not be considered to limit the scope of the coating, or of any assembly system configured to apply a coating to the interior of an electronic device. The term "moisture-resistant" may also refer to the ability of a coating to restrict permeation of or repel organic liquids or vapors (e.g., organic solvents, etc.), as well as a variety of other substances or conditions that might pose a threat to an electronic device or its components.

A specific embodiment of a system for assembling an electronic device that includes internal moisture resistance includes a surface mount technology (SMT) element, an assembly element and at least one coating element.

In the SMT element, subassemblies of electronic components (e.g., a circuit board, one or more semiconductor devices, etc.) are assembled. More specifically, a surface mount device (SMD), such as an unpackaged and/or packaged semiconductor device and/or other electronic components (e.g., resistors, capacitors, inductors, transducers, sensors, modules, etc.), may be electrically coupled and physically secured to conductive elements, which, without specifying a shape, may be referred to as "pads," on the surface of a circuit board or other suitable carrier. The SMT element, as part of an assembly process, may be automated and, thus, include apparatuses that enable each SMD to be properly positioned, electrically coupled and physically secured to the circuit board at an appropriate location. Electrical coupling of SMDs to the circuit board may include the connection of a relatively large number of conductive elements of an SMD to the circuit board simultaneously or in rapid succession. Without limitation, techniques such as screen printing solder paste onto pads on the surface of the circuit board, use of pick-and-place devices to position the conductive elements (e.g., pads, terminals, leads, pins, etc.) of an SMD (e.g., a so-called ball grid array (BGA) device, a packaged semiconductor device with pins or leads, etc.) on the solder paste, and placement of the assembly into a reflow oven may be used to form intermediate conductive elements, in the form of solder joints, between each conductive element of the SMD and its corresponding conductive element on the circuit board. As another non-limiting example, an SMT element may use pin connections or other intermediate conductive elements to secure and electrically couple one or more SMDs to a circuit board or other suitable carrier. Of course, an SMT element may employ other suitable techniques and other types of intermediate conductive elements (e.g., elastomeric films with z-axis conductive elements, such as so-called "zebra strips," etc.) to secure and electrically couple one or more SMDs to a circuit board or other suitable carrier. In any event, the SMT element forms an electronic subassembly, or an electronic device under assembly.

In the assembly element, other components of a finished electronic device are assembled with the circuit board, another suitable carrier or electronic device under assembly. These other components may include all of the other components of the electronic device, including various electronic components, transducers (e.g., audio elements, cameras, sensors, etc.), communication components, user interface components (e.g., display screens, buttons, transducers, etc.), other electronic devices (e.g., location devices, sensors or detectors, etc.) and housing, or case, components. Some of the electronic components assembled with the circuit board, other suitable carrier or electronic device under assembly at the assembly element are configured for simpler electrical coupling than the SMDs (e.g., they may include relatively low numbers and/or densities of electrical connectors, they may include plug-in type connectors, etc.). In some embodiments, the relatively simple electrical connections made at the assembly element may enable an assembly system (e.g., an assembly line, etc.) to include one or more stations where assembly line workers manually couple components with the circuit board or electronic device under assembly. Optionally, the assembly element may include one or more automated stations for assembling components with the circuit board or the electronic device under assembly.

Some embodiments of assembly systems may include a pre-coating processing element. Such an element may be configured to prepare one or more regions, including any selected regions, of an electronic device under assembly to receive a moisture-resistant coating. Without limiting the scope of the disclosed subject matter, a pre-coating process element may be configured to promote adhesion of a moisture-resistant coating to selected regions of the electronic device under assembly. In some embodiments, such a pre-coating process element may be configured to clean contaminants from the surface(s) to which a mask or a moisture-resistant coating is to be applied. A pre-coating process element may be configured to modify (e.g., modify the texture of, etc.) surface(s) to which a mask or a moisture-resistant coating is to be applied. As another option, a pre-coating process element may be configured to apply an adhesion promoter (e.g., a silane, such as SILQUEST® A-174 silane available from Crompton Corporation of Middlebury, Conn.; etc.) to the surface(s) to which the moisture-resistant coating is to be applied.

An assembly system may also include a masking element. The masking element may be configured to apply a mask to the circuit board or electronic device under assembly or assemble a mask with the circuit board or electronic device under assembly, and to one or more components that have been assembled with the circuit board or electronic device under assembly. A mask may be configured to prevent the deposition or formation of a moisture-resistant coating on selected parts of the circuit board or one or more components of the electronic device under assembly that are carried by the circuit board. Thus, a mask may ultimately prevent a moisture-resistant coating from inhibiting the establishment of electrical connections to various features, from inhibiting the transfer of heat away from various components, from inhibiting the operation of various components, or from otherwise detrimentally affecting the performance of the electronic device.

The coating element of an assembly system may be configured to impart at least a portion of an electronic device under assembly with moisture resistance. In some embodiments, the coating element may apply a moisture-resistant coating to at least some parts of an electronic device under assembly and, more specifically, to surfaces that will be located within an interior of the electronic device under assembly. The coating element may be configured to non-selectively apply a moisture-resistant coating, or it may be configured to apply a moisture-resistant coating to selected portions of the electronic device under assembly. A coating element may be incorporated into an assembly system at a number of different locations in the system.

Some embodiments of an assembly system incorporate at least one coating element into their SMT elements. In other embodiments, a coating element may be located between the SMT element and the assembly element. In some embodiments, one or more coating elements may be incorporated into the assembly element. In such embodiments, a coating element may be configured to apply a moisture-resistant coating to a component prior to its assembly with other components of the electronic device under assembly, or it may be configured to apply a moisture-resistant coating to a component that has been assembled with the circuit board or another component of the electronic device under assembly.

One or more of a variety of different types of coating elements may be incorporated into a system for assembling electronic devices. Without limitation, an assembly system may include a coating element configured to apply a polymer coating (e.g., poly(p-xylylene) polymer, or parylene; etc.) to an electronic device under assembly. Such a coating element may be configured to deposit the polymer coating by molecular vapor diffusion. Alternatively, the coating element may employ chemical vapor deposition (CVD), plasma-based deposition processes (including, but not limited to, plasma enhanced CVD processes), physical vapor deposition (PVD), atomic layer deposition (ALD) or other material deposition processes. As another alternative, a coating element may comprise an apparatus that physically applies (e.g., by printing, spraying, rolling, brushing, dipping, otherwise coating, etc.) a coating material onto a substrate. In general, the moisture-resistant coating that results from the coating process is conformal to the electronic device surface.

In addition to a coating element, a system for assembling electronic devices may include one or more material removal elements, which may remove selected portions of a moisture-resistant coating from electronic devices under assembly. A material removal element may be configured to remove material from one or more selected portions of a moisture-resistant coating on an electronic device under assembly by any suitable means. Without limitation, a material removal element may be configured to ablate, dissolve, vaporize, decompose, mechanically remove or otherwise take material from each selected region of the moisture-resistant coating.

In some embodiments, an assembly system may comprise an assembly line, in which the coating element is in-line or on-line with other components of the assembly line. In other embodiments, the coating element may be located remotely, or off-line, from an assembly line. In embodiments of systems where the coating element is located off-line, it may be located in the same facility as an assembly line. Regardless of whether the coating element is located in-line or off-line, the assembly system or assembly line may be configured for the manufacture of electronic devices, including portable electronic devices, such as mobile telephones, portable computers, tablets, portable media players, cameras and the like.

Methods in which electronic assemblies or subassemblies are rendered moisture resistant are also disclosed. Such a method includes applying a coating to at least portions of assembled electronic components. Such a method may include applying a moisture-resistant coating to an electronic device under assembly, or electronic subassembly, and, thereafter, assembling at least one component with the electronic device under assembly. In some embodiments, the assembled component may (at least during assembly) lack a moisture-resistant coating. In other embodiments, the assembled component may include a moisture-resistant coating, which may be the same as or differ from (e.g., in material, in texture, in other characteristics) the moisture-resistant coating on the electronic device under assembly. When the moisture-resistant coating on the assembled component is positioned adjacent to the moisture-resistant coating on the electronic device under assembly, a discernible boundary, or seam, may be defined between the adjacent moisture-resistant coatings. Further coating after assembling components with an electronic device under assembly may also result in the formation of discernible boundaries between adjacent moisture-resistant coatings.

Other aspects, as well as features and advantages of various aspects, of the disclosed subject matter will become apparent to those of skill in the art through consideration of the ensuing description, the accompanying drawings and the appended claims.

DETAILED DESCRIPTION

Figure 1:
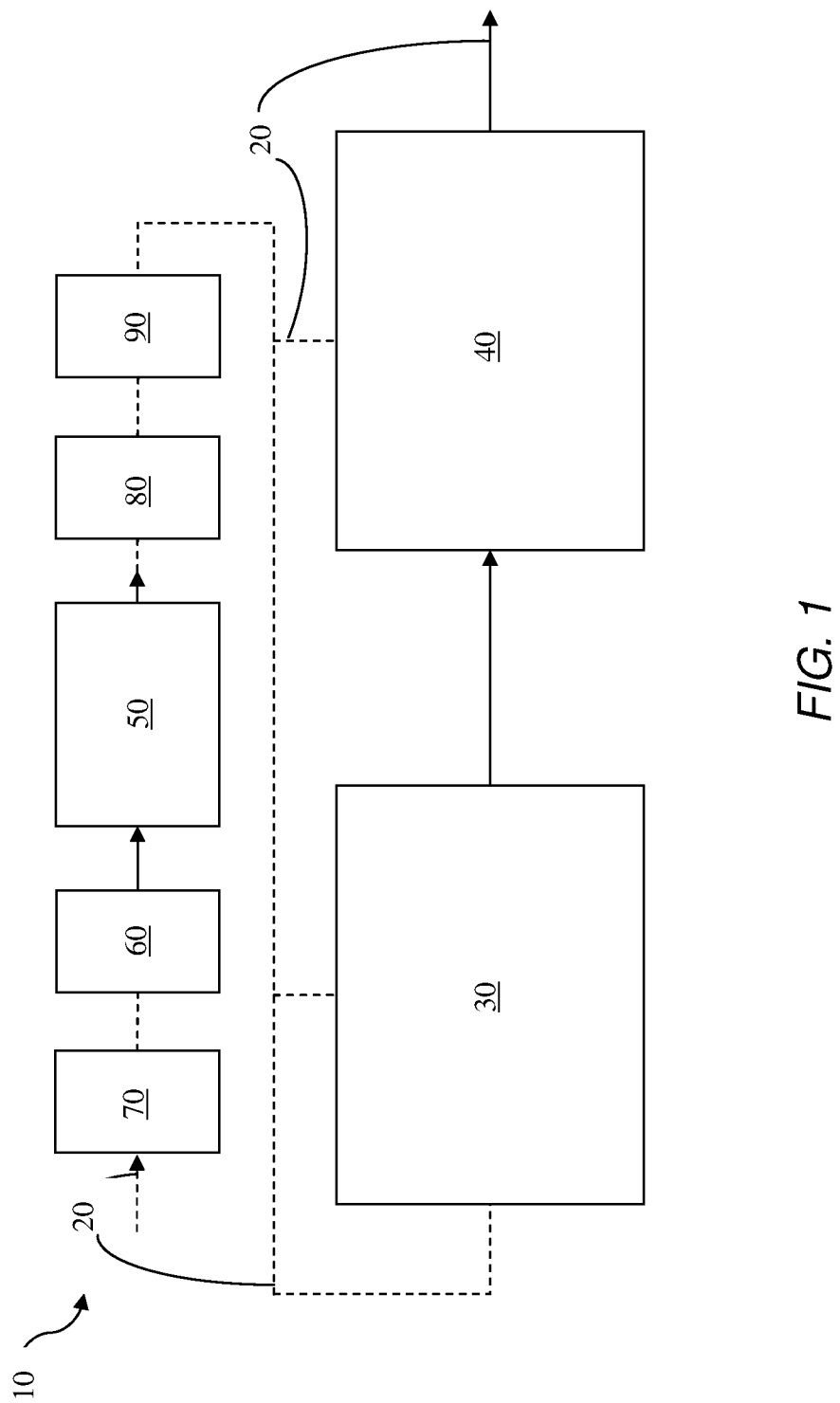
FIG. 1 is a schematic representation of an embodiment of a system for assembling electronic devices.

A system that incorporates teachings of this disclosure includes one or more coating elements. Each coating element of such a system is configured to apply a moisture-resistant coating to surfaces of one or more components of an electronic device. Because of its moisture resistance, or hydrophobicity, the coating may be configured to prevent electrical shorting and/or corrosion of one or more components of the electronic device.

Any of a variety of metrics may be used to quantify the moisture resistance of each coating formed by an assembly system. For example, the ability of a coating to physically inhibit moisture, such as water in liquid or vapor form, from contacting a coated feature may be considered to impart the coating with moisture resistance.

As another example, the moisture resistance of a coating may be based on more quantifiable data, such as the rate at which one or more types of moisture permeate through the coating. In embodiments where a coating is configured to limit the penetration of water or another aqueous material, the moisture resistance of that coating may be quantified in terms of its water vapor transfer rate. The water vapor transfer rate of a coating may be measured using known techniques in units of g/m²/day or in units of g/100 in²/day (e.g., less than 2 g/100 in²/day, about 1.5 g/100 in²/day or less, about 1 g/100 in²/day or less, about 0.5 g/100 in²/day or less, about 0.25 g/100 in²/day or less, about 0.15 g/100 in²/day or less, etc., through a film having a minimum thickness or an average thickness of about 1 mil (i.e., about 25.4 μm), at a temperature of 37° and at a relative humidity of 90%).

Another way in which the moisture resistance of a coating may be determined is the contact angle of liquid that has been applied to a surface of the coating by an acceptable technique (e.g., the static sessile drop method, the dynamic sessile drop method, etc.). Contact angles may be used to determine the ability of a coating to repel a certain type of moisture (e.g., due to the material from which the coating is made, due to a microstructure or nanostructure of a surface of the coating, etc.). In embodiments where a coating is configured to prevent exposure of one or more components of an electronic device to aqueous moisture, the hydrophobicity of the surface may be measured by determining the angle the base of a water droplet makes with the surface, from beneath a base of the water droplet; for example, using the Young equation, i.e.:

$$\theta_C = \arccos \frac{r_A \cos\theta_A + r_R \cos\theta_R}{r_A + r_R},$$

where $\theta_A$ is the highest, or advancing, contact angle; $\theta_R$ is the lowest, or receding, contact angle;

$$r_A = \sqrt[3]{\frac{\sin^3\theta_A}{2 - 3\cos\theta_A + \cos^3\theta_A}};$$

and $$r_R = \sqrt[3]{\frac{\sin^3\theta_R}{2 - 3\cos\theta_R + \cos^3\theta_R}}.$$

If the surface is not water repellant (i.e., if it is hydrophilic, etc.), the water will spread somewhat, forming a water contact angle of less than 90° with the surface. In contrast, a water repellant (i.e., hydrophobic, etc.) surface, which, for purposes of this disclosure, may be considered to be moisture resistant, will prevent the water from spreading, resulting in a water contact angle of 90° or greater. The more the water beads on a surface, the greater the water contact angle. When water droplets bead on a surface such that the water contact angle with the surface is about 120° or more, the surface is considered to be highly hydrophobic. When the angle at which water contacts a surface exceeds 150° (i.e., a water droplet on the surface is nearly spherical), the surface is said to be "superhydrophobic." Similar techniques may be used to determine the ability of a coating to repel or otherwise control exposure of one or more components of an electronic device to other types of moisture, such as organic materials.

Moisture-resistant coatings formed from different types of parylene (e.g., parylene N, parylene C, etc.) and having thicknesses of from about one micron to about ten microns exhibit water contact angles of about 90° or more. More specifically, the water contact angles of these films ranged from 87° to 99°. Accordingly, these films may be referred to as "hydrophobic coatings."

Of course, other measures of moisture resistance may also be employed to determine the ability of a moisture-resistant coating to prevent exposure of a coated surface and, thus, a coated feature, component, assembly or device to one or more types of moisture.

While the coating element(s) of an assembly system may be configured to apply a moisture-resistant coating to exterior surfaces of one or more components of an electronic device under assembly, when the electronic device is fully assembled, one or more surfaces on which a moisture-resistant coating resides may be located within an interior of a finished electronic device. Thus, an assembly system may be configured to assemble an electronic device that, once assembly is complete, includes a moisture resistant coating on internal surfaces, or an internally confined moisture-resistant coating.

FIG. 1 depicts an embodiment of an assembly system 10. In some embodiments, part or all of the assembly system 10, including one or more individual components of the assembly system 10, may operate under control of a factory automation software system (not shown). Among other elements, the assembly system 10 may include a conveyor 20 that transports an electronic device under assembly 100 (FIGS. 4 and 5) through an SMT element 30, an assembly element 40 and at least one coating element 50. The conveyor 20 may comprise part of an assembly line, or it may include elements that enable it to carry one or more electronic devices under assembly 100 away from an assembly line (which may include the SMT element 30 and/or the assembly element 40) to an off-line coating element 50 (and, optionally, other off-line components of the assembly system 10) and back to the assembly line.

Figure 2:
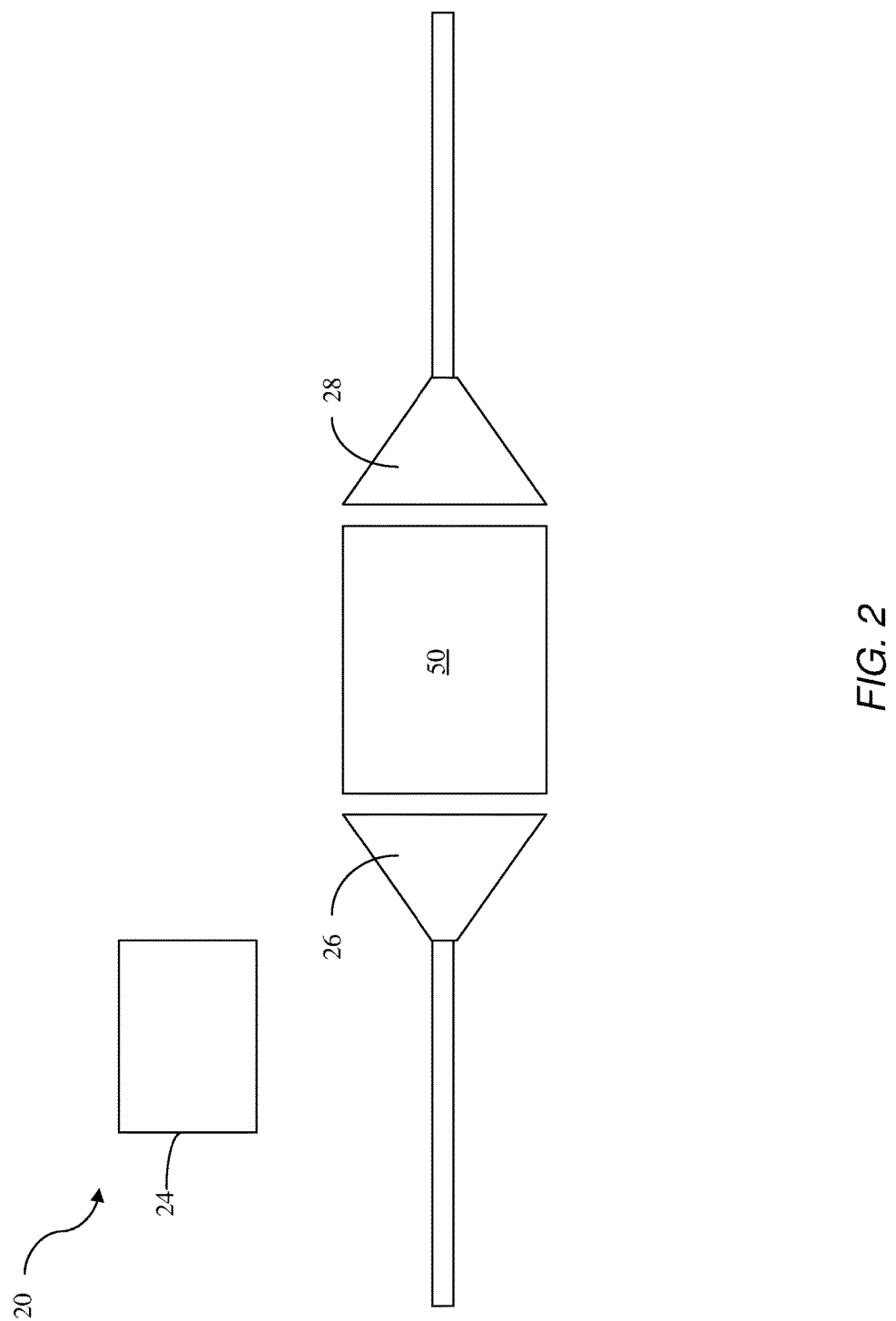
FIG. 2 schematically represents an embodiment of a conveyer of an assembly system.

The conveyor 20 may include a number of components, as known in the art, for transporting a plurality of electronic devices under assembly 100 to and from various components of each element (e.g., the SMT element 30, the assembly element 40, each coating element 50, etc.) of the assembly system 10. In embodiments where one or more elements (e.g., the coating element(s) 50, etc.) prevent the constant movement of each electronic device under assembly 100 through the assembly system 10, as depicted by FIG. 2, the conveyor 20 may include a controller 24. The controller 24, which may control the operation of one or more elements of the conveyor 20, may comprise part of a factory automation system (not shown) for controlling the assembly system 10, it may operate under control of a factory automation system, or it may operate independently from a factory automation system and/or other components of the assembly system 10.

The conveyor 20 may also include a plurality of other components that are configured to manage throughput. For example, the conveyor 20 may include a collection component 26 configured to collect a plurality of electronic devices under assembly 100 prior to their introduction into each element or component that inhibits constant throughput (e.g., the depicted coating element 50, etc.), as well as a feed component 28 configured to receive and/or release a plurality of electronic devices under assembly 100 from each element or component that inhibits constant throughput. In various embodiments, operation of the components of conveyer 20 of an assembly system 10 may be synchronized (e.g., by the controller 24 and/or a factory automation system, etc.) to transport electronic devices under fabrication 100 through each element (and its corresponding components) at a desired rate. In a specific embodiment, such synchronization may be accomplished by way of programming executed by a controller 24, which, in turn, controls operation of various components of the conveyor 20.

Figure 3:
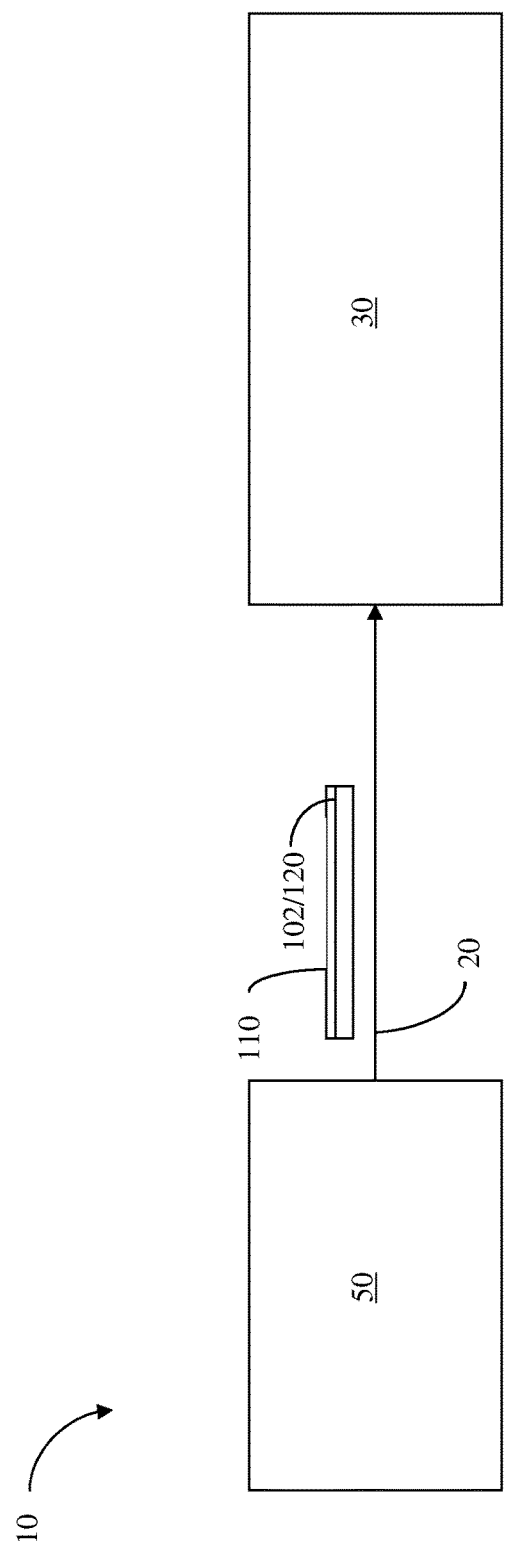
FIG. 3 schematically illustrates an embodiment of assembly system in which a coating element is located to apply a moisture-resistant coating on a component before the component is delivered to the SMT element.

As illustrated by FIG. 3, in some embodiments, a coating element 50 may be located upstream from the SMT element 30 of an assembly system 10. In such an embodiment, the coating element 50 may be configured to apply a moisture-resistant coating 110 (e.g., of parylene N, parylene C, etc.) to each circuit board 102 and/or each SMD 120. Associated apparatus 52 (e.g., mask and etch devices, etc.) may be configured to expose conductive elements 104 (e.g., pads, terminals, leads, pins, etc.) (FIG. 4) of the circuit board 102 or conductive elements 122 (e.g., pads, terminals, leads, pins, etc.) (FIG. 4) of the SMD 120, respectively, through the moisture-resistant coating 110.

Figure 4:
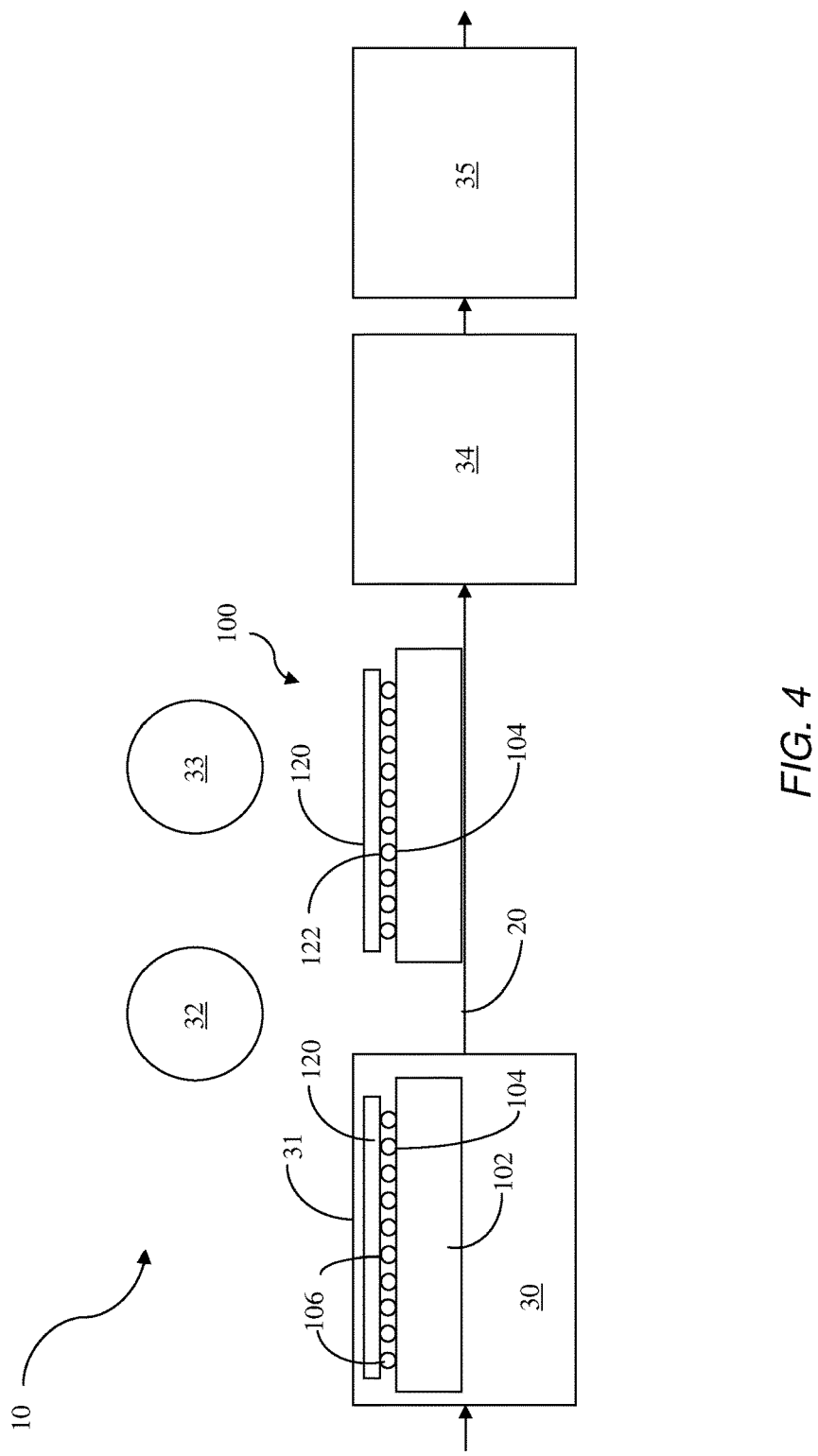
FIG. 4 is a schematic representation of an SMT element of an assembly system.

Turning now to FIG. 4, in the SMT element 30, an SMD 120, such as an unpackaged and/or packaged semiconductor device, is electrically coupled and physically secured to the circuit board 102. While FIG. 4 depicts an assembly in which solder electrically couples the SMD 120 to the circuit board 102 (or pads, leads or other terminals of the SMD 120 to corresponding pads, leads or other terminals of the circuit board 102), other types of intermediate conductive elements (e.g., leads, pins, zebra strips, etc.) may also be used. In some embodiments, the SMT element 30 may be automated (e.g., operation under control of a factory automation system, an independent controller, etc.) and, thus, include apparatuses that enable each SMD 20 to be properly positioned, electrically coupled and physically secured to the circuit board 102 at an appropriate location.

The SMT element 30 may include a conductor application component 31, which applies conductive material (e.g., aluminum, gold, solder, etc.) or other intermediate conductive elements 106 to various conductive elements 104 of the circuit board 102. Any of a variety of different types of intermediate conductive elements 106 may be secured to or formed on the conductive elements 104, including, without limitation, solder paste (which may be screen printed or otherwise applied to pads), solder balls, solder bumps, columns, pillars, leads (e.g., J-shaped leads, gullwing-shaped leads, etc.) or other structures formed from electrically conductive material, such as a metal, metal alloy, conductive epoxy, or the like; a so-called "z-axis" conductive film, which includes a dielectric substrate with discrete, electrically isolated conductive elements extending through the thickness of the dielectric substrate; and the like. In embodiments where the intermediate conductive elements 106 are formed from solder, the conductor application component 31 may comprise apparatus (e.g., a screen printing apparatus, a jet printing device, etc.) for selectively applying solder paste (which includes solder and flux) to the conductive elements 104.

A pick-and-place component 32 may transport each circuit board 102 from the conductor application component 31 to an appropriate location on the conveyor 20. As the conveyor 20 transports each circuit board 102, another pick-and-place component 33 may assemble one or more SMDs 120 with that circuit board 102. During assembly of each SMD 120 with a circuit board 102, conductive elements 122 of the SMD 120 may be aligned with corresponding conductive elements 104 of the circuit board 102, and the SMD 120 may be secured to the circuit board 102. In embodiments where solder paste has been applied to conductive elements 104 of the circuit board 102 to subsequently form the intermediate conductive elements 106, as each SMD 120 is assembled with the circuit board 102, the conductive elements 122 of the SMD 120 may be brought into contact with the intermediate conductive element 106 (or its precursor; e.g., a quantity of solder paste, etc.) that protrudes from a corresponding conductive element 104 of the circuit board 102.

With the circuit board 102 and its SMD(s) 120 assembled, the conveyor 20 may transport the resulting electronic device under assembly 100 to a coupling component 34. In embodiments where the intermediate conductive elements 106 are to be formed from solder, the coupling component 34 may comprise a solder reflow apparatus, such as a reflow oven. Of course, other embodiments of coupling components 34 may be included in the SMT element 30 of an assembly system 10, as appropriate for the intermediate conductive elements 106 used to electrically couple one or more SMDs 120 to each circuit board 102.

An SMT element 30 may optionally include one or more cleaning components 35. The cleaning component 35, if present, may facilitate the adhesion of a moisture-resistant coating 110 to an electronic device under assembly 100. More specifically, a cleaning component 35 may at least partially remove residual flux or other contaminants from surfaces of the electronic device under assembly 100, which contaminants may prevent adhesion of a moisture-resistant coating 110 to those surfaces. Without limitation, the cleaning component 35 of an SMT element 30 may include degassing apparatus, washing (and, optionally, drying) apparatus, other apparatus for reducing the deleterious effects of contaminants, or a combination of any of the foregoing. A degassing apparatus may facilitate the removal of volatile compounds of any residual flux, which volatile compounds may prevent adhesion of a moisture-resistant coating 110, from the electronic device under assembly 100. A washing apparatus may substantially remove all residual flux from the electronic device under assembly 100. Other apparatus may decrease the deleterious effects of contaminants by a variety of techniques (e.g., degreasing, oxidation, vaporization, disintegration, physical movement, etc.).

In embodiments where a moisture-resistant coating 110 has been applied to the circuit board 102 and/or an SMD 120 in advance of assembling the SMD 120 with the circuit board 102 (FIG. 3), any reason for including a cleaning component 35 as part of the SMT element 30 may be eliminated, regardless of whether or not any residual flux or other contaminants remain on the electronic device under assembly 100. Additionally, the rate at which the moisture-resistant coating 110 is applied to the circuit board 102 and/or the SMD 120 prior to their assembly may be faster than the rate at which the same moisture-resistant material (e.g., parylene N, parylene C, etc.) may subsequently be introduced between the circuit board 102 and the SMD 120, and may provide more reliable moisture resistance than the introduction of the same moisture-resistant material between the circuit board 102 and the SMD 120.

In such embodiments, at least a portion of the moisture-resistant coating 110 may reside between the SMD 120 and the circuit board 102 (e.g., on the circuit board 102, beneath the SMD 120; etc.) before other components are assembled with the electronic device under assembly 100. In some embodiments, flux and/or other contaminants may be present on exposed surfaces of the moisture-resistant coating 110.

Figure 5:
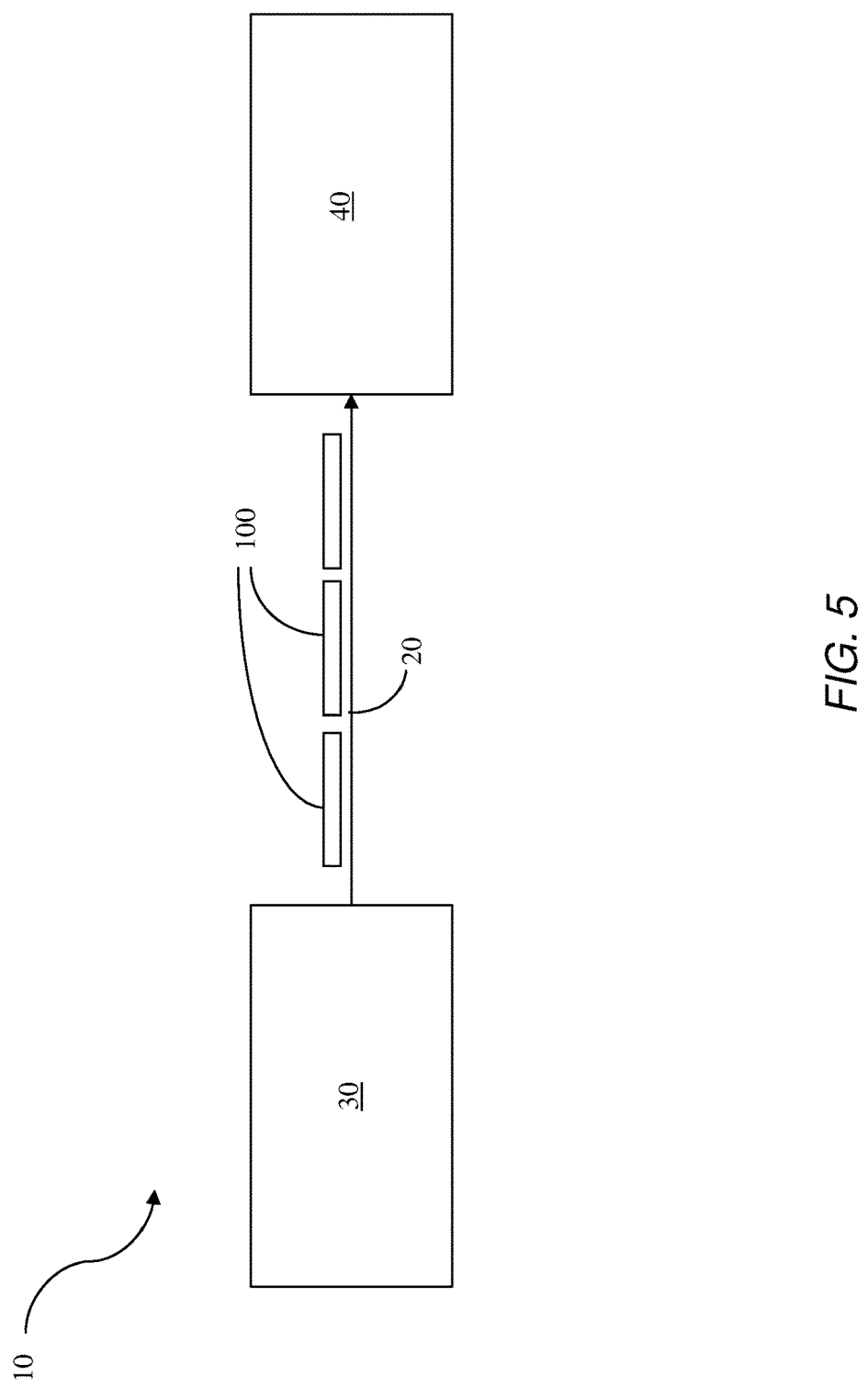
FIG. 5 depicts an embodiment of assembly system in which an electronic device under assembly, or electronic subassembly, is coated directly after SMT processing.

Once the SMD(s) 120 has (have) been assembled with and electrically coupled to the circuit board 102, further processing of the electronic device under assembly 100 may occur. As shown in FIG. 5, the conveyor 20 may transport the electronic device under assembly 100 (FIGS. 4 and 5) to the assembly element 40 of the assembly system 100 before any (further) coating is effected or otherwise occurs. In other embodiments, the conveyor 20 may transport the electronic device under assembly 100 from the SMT element 30 directly to a coating element 50.

Figure 6:
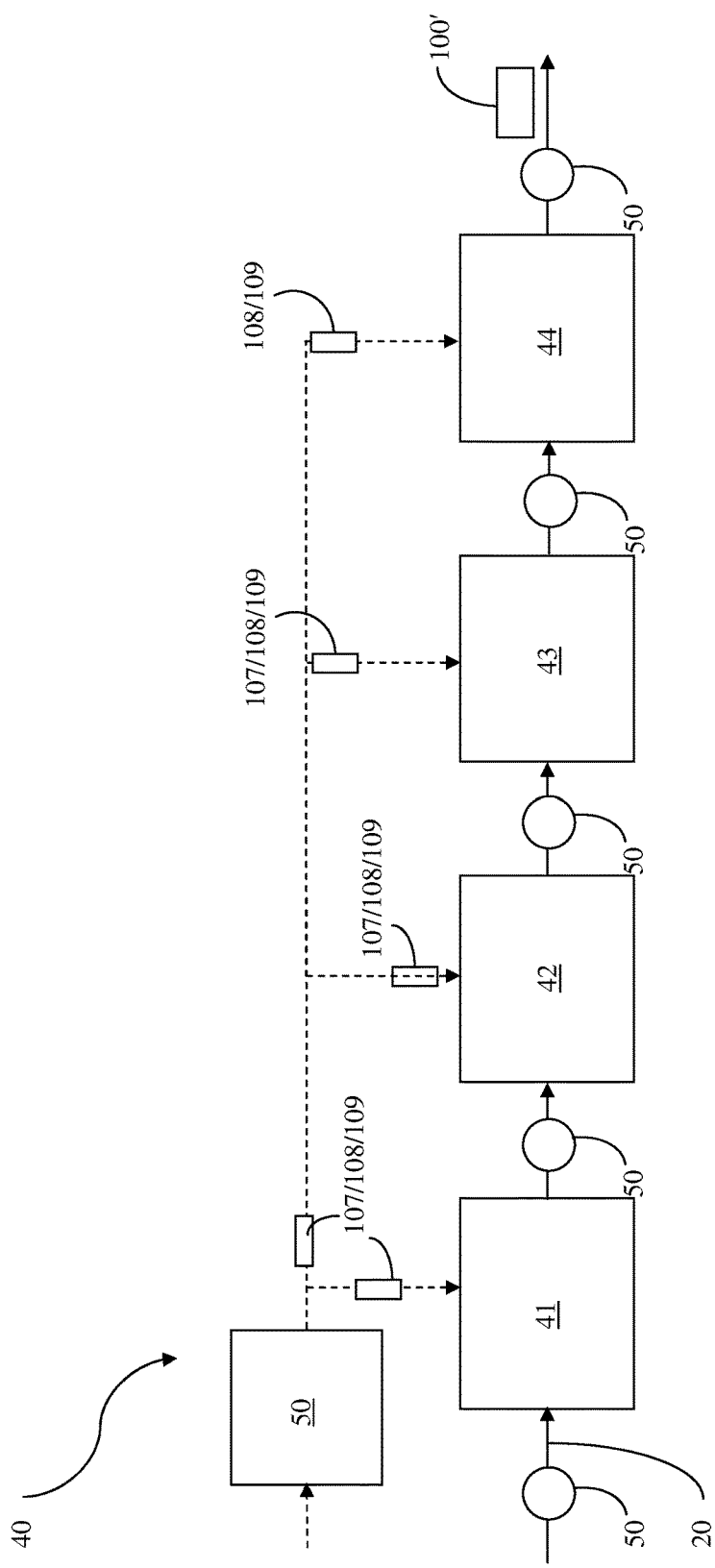
FIG. 6 schematically shows an embodiment of an assembly element of an assembly system, including various possible locations for coating elements relative to the assembly element.

In the assembly element 40, various representative embodiments of which are illustrated by FIG. 6, a variety of components (i.e., all of the other components of the electronic device) are assembled with the circuit board 102 to build a complete electronic device 100'. The components that are added to the circuit board 102 by the assembly element 40 may include electronic parts 107, user interface features 108, and housing elements 109. The assembly element 40 may include automated components, manual components (i.e., where individuals assemble and/or electrically couple components to the circuit board), or a combination of automated components and manual components.

Electronic parts 107 may include bare or packaged semiconductor devices, as well as parts that may be shaped differently than standard SMDs, which, therefore, are sometimes referred to as "irregular" or "odd form" electronic components and parts that may be sensitive to temperatures generated or used by various components of the SMT element 30. Non-limiting examples of such electronic parts 107 include modules, ancillary boards, antennas, input devices (e.g., microphones, cameras, touch-sensitive elements, etc.); output devices (e.g., speakers, display screens, headphone jacks, etc.), ports (e.g., for battery charging, for communication, etc.), flashes (lights), proximity sensors, silent mode components and even electronic devices (e.g., resistors, capacitors, inductors, diodes, etc), as well as other components.

A variety of known techniques may be used to electrically couple any electronic parts 107 to another component of an electronic device under assembly 100 (e.g., to the circuit board 102 of the electronic device under assembly 100, to other electronic parts 107, etc.). For example, one or more soldering stations 41 may be used to solder electronic components to the circuit board 102. A soldering station 41 may be configured to accommodate an individual who manually operates soldering equipment. Alternatively, or in addition, a soldering station may be automated (e.g., employ a laser beam, a focused infrared beam, localized convection equipment, etc.).

As another example, electronic parts may be plugged into the circuit board 102 (or at least into receptacles associated with the circuit board 102) at one or more plug-in stations 42. Plug-in stations 42 may accommodate individuals who manually connect electronic parts to an electronic device under assembly 100 (e.g., with pins, flex connectors, etc.), they may comprise automated equipment for coupling electronic parts to the electronic device under assembly 100, or an assembly system 10 may include a combination of manual and automated plug-in stations 42.

Of course, an assembly element 40 may include other electrical connection components 43, as known in the art, or combinations of different types of electrical connection components (e.g., soldering stations 41, plug-in stations 42 and/or other electrical components 43, etc.), suitable for electrically coupling electronic parts to a electronic device under assembly 100.

User interface components 108, such as buttons, knobs, switches, keyboards, display covers and the like, as well as batteries, cables, housing components 109 and other components of the finished electronic device 100', may be assembled with an electronic device under assembly 100 at one or more case assembly components 44 of the assembly element 40 of an assembly system 10. Each case assembly component 44 may include manual elements (e.g., one or more stations where an individual assembles components with the device under fabrication 100, etc.), automated elements, or a combination of manual and automated elements.

FIG. 6 illustrates a number of possible locations where a coating element 50 may be positioned relative to the assembly element 40. The location of a coating element 50 may enable the application of a moisture-resistant coating 110 (FIG. 3) to components of a finished electronic device 100' (e.g., electronic parts 107, user interface components 108, housing components 109, etc.) prior to their assembly with other components or with an electronic device under assembly 100. A coating element 50 may be positioned within the assembly element 40 at a location that ensures that a moisture-resistant coating 110 is applied to all critical features (e.g., internal components, etc.) of an electronic device under assembly 100. A coating element 50 positioned downstream from other components of the assembly element 40 may be used to provide a coating on all or parts of the interior and/or exterior of the finished electronic device 100'.

The inclusion of two or more coating elements 50 in the assembly element 40 may further optimize the application of moisture-resistant coatings 110 to critical features of the electronic device under assembly 100 and, thus, within the interior of a finished electronic device 100'. In some embodiments, the coating element 50 is positioned to apply a moisture-resistant coating 110 to exposed surfaces of an electronic device under assembly 100, or to components that are to be assembled with the electronic device under assembly 100, that will ultimately be located within an interior of, or internally confined within, the finished electronic device 100'.

The coating element 50 may comprise any of, or any combination of, a variety of embodiments of coating apparatuses. In a specific embodiment, a coating element 50 of an assembly system 10 may comprise an apparatus configured to apply a polymer, such as an unsubstituted or a substituted poly(p-xylylene) (i.e., parylene), to at least a portion of an electronic device under assembly. In a more specific embodiment, the coating element 50 may comprise an apparatus that forms reactive monomers, which monomers may then be deposited onto and form polymers on one or more surfaces that are to be made moisture resistant or moisture proof (e.g., waterproof, etc.). In specific embodiments, the coating element may be configured to deposit poly(p-xylylene), including unsubstituted and/or substituted units, onto one or more surfaces that are to be rendered moisture resistant or moisture proof. Examples of coating elements that function in this manner are described by U.S. patent application Ser. Nos. 12/104,080, 12/104,152 and 12/988,103, the entire disclosure of each of which is, by this reference, hereby incorporated herein. U.S. patent application Ser. Nos. 12/446,999, 12/669,074 and 12/740,119, the entire disclosures of all of which are, by this reference, hereby incorporated herein, also disclose embodiments of equipment and/or processes that may be employed by a coating element 50 of an assembly system 10 to form moisture-resistant coatings 110 (FIG. 3). Various embodiments of apparatuses that may be employed as a coating element 50 of an assembly system 10 include, without limitation, molecular vapor diffusion equipment, chemical vapor deposition (CVD) equipment, physical vapor deposition (PVD) equipment (e.g., devices that employ evaporation deposition processes (including, but not limited to e-beam evaporation, sputtering, laser ablation, pulsed laser deposition, etc.), atomic layer deposition (ALD) equipment and physical application apparatuses (e.g., printing equipment, spray-on equipment, roll-on equipment, brush-on apparatuses, dipping equipment, coating equipment, etc.). Of course, other embodiments of coating elements 50 may also be used in an assembly system 10.

Materials that may be applied by a coating element 50 of an assembly system 10 may include, but are certainly not limited to, thermoplastic materials, curable materials (e.g., radiation-curable materials, two-part materials, thermoset materials, room-temperature curable materials, solvent evaporation, etc.). In some embodiments, the coating element 50 may be configured to apply a moisture-resistant film having a sufficient thickness to provide a desired level of moisture resistance within a relatively short period of time. In various embodiments, a coating element 50 may be configured to deposit a film (e.g., a parylene film, etc.) having a minimum thickness or an average thickness of at least one micron in less than an hour, in about fifteen minutes or less, in about five minutes or less, or even in about two minutes or less.

In the context of an entire assembly system 10, a plurality of different coating elements 50, and even different types of coating elements 50, may be located to provide desired types of coatings on different types of features. Without limitation, one coating element 50 may be configured to provide a moisture-resistant coating 110 (FIG. 3) in small spaces between different components of an electronic device under assembly 100 (e.g., between an SMD 120 and a circuit board 102, etc.), while another coating element 50 may be configured to provide a conformal, blanketed moisture-resistant coating 110 on surfaces that are exposed during the coating process, and another coating element 50 may selectively apply a moisture-resistant coating 110 to certain features.

With returned reference to FIG. 1, in addition to the above-described elements of an assembly system 10, the assembly system 10 may include additional components.

In some embodiments, an assembly system 10 may include one or more masking apparatuses 60. A masking apparatus 60 may be configured to prevent a moisture-resistant coating 100 (FIG. 3) from being applied to surfaces where its application is not desired (e.g., on electrical contacts; on some moving parts; on components that may not, if coated, function as intended; where intermittent mechanical connection is desired (e.g., in some mechanical or electro-mechanical buttons, etc.); etc.). Some embodiments of masking apparatuses 60 comprise physical masking elements, which are configured to be assembled with a component to which a moisture-resistant coating 110 is to be applied, while other embodiments of masking apparatuses 60 are configured to deposit a selectively removable temporary mask onto a component to which a moisture-resistant coating 110 is to be applied. Of course, an assembly system 10 that includes one or more masking apparatuses 60 upstream from a coating element 50 may also include one or more demasking elements (not shown) downstream from the coating element 50 to expose features that have been masked and, thus, do not have a moisture-resistant coating 110 adhered thereto.

Some embodiments of an assembly system 10 may include one or more surface treatment elements 70. A surface treatment element 70 may be configured to prepare a surface of the electronic device under assembly 100 for application of the moisture-resistant coating 110 (FIG. 3). In some embodiments, a surface treatment element 70 may be configured to enhance adhesion of a moisture-resistant coating 110 to at least a portion of the electronic device under assembly 100 (e.g., by cleaning or otherwise removing contaminants, by passivating a surface to which material is to be applied, by altering a texture of a surface to which material is to be applied, by depositing an adhesion promoter on a surface to which material is to be applied, etc.). Optionally, a surface treatment element 70 may be configured to prevent materials from adhering to one or more surfaces of the electronic device under assembly 100 (e.g., by applying a non-stick or release material to surfaces or portions thereof from which material(s) may be subsequently removed, etc.). These and other embodiments of surface treatment elements 70 may be located upstream from the coating element 50 of the assembly system 10.

A surface treatment element 70 may be configured to modify a surface of at least a portion of the electronic device under assembly 100 in a manner that imparts the moisture-resistant coating 110 with at least one desired characteristic (e.g., moisture repellency, such as a so-called "lotus leaf"

structure or texture, etc.). Alternatively, or in addition, a surface treatment element 70 may clean or otherwise treat surfaces of an electronic device under assembly 100 after a moisture-resistant coating 110 has been applied to at least portions of the electronic device under assembly 100. Surface treatment elements 70 that perform these and other functions may be located downstream from the coating element of the assembly system 10.

An assembly system 10 may include at least one coating inspection element 80 located downstream from a coating element 50. A coating inspection element 80 may be configured to provide some level of control over the quality of a moisture-resistant coating 110 and of the electronic device under assembly 100 to which the moisture-resistant coating 110 has been applied. Without limitation, each coating inspection element 80 may enable an analysis of the presence of a moisture-resistant coating 110 (FIG. 3), the thickness of the moisture-resistant coating 110, the surfaces on which the moisture-resistant coating 110 resides, the quality of a moisture-resistant coating 110 (e.g., a measure of the optical quality of a moisture-resistant coating 110 may correlate to the presence of contaminants in the moisture-resistant coating 110, the permeability or impermeability of the moisture-resistant coating 110, etc.), or any other useful information about a moisture-resistant coating 110 that has been applied by a coating element to an electronic device under assembly 100. By way of non-limiting example, a coating inspection element 80 may comprise an optical interferometer. Information from a coating inspection element 80 may be used to provide feedback control over a coating element 50 associated with the inspection element 80 or over any other component of an assembly system 10.

With returned reference to FIG. 1, in some embodiments, an assembly system 10 may include a material removal element 90. The material removal element 90 may be configured to selectively remove material from one or more regions of a moisture-resistant coating 110 (FIG. 3). Such material removal may be effected by any suitable means, without detrimentally affecting underlying or adjacent portions of the electronic device under assembly from which the material is removed. As an example the material removal element 90 may be configured to ablate, vaporize or sublimate the material of the moisture-resistant coating 110 (e.g., with a properly placed, pulsed or continuous laser beam, etc.). As another example, the material removal element 90 may selectively apply a solvent (e.g., by inkjet processes, screen printing, etc.) that will selectively remove a material of the moisture-resistant coating 110 on an electronic device under assembly. In yet another example, the material removal element 90 may be configured to mechanically remove material from one or more selected regions of a moisture-resistant coating 110 (e.g., by cutting, abrading, etc.).

Although the foregoing description contains many specifics, these should not be construed as limiting the scope of the disclosed subject matter or of any of the appended claims, but merely as providing information pertinent to some specific embodiments that may fall within the scopes of the appended claims. Features from different embodiments may be employed in combination. In addition, other embodiments of the disclosed subject matter may also be devised which lie within the scopes of the appended claims. The scope of each claim is, therefore, indicated and limited only by it plain language and the legal equivalents to the recited subject matter. All additions, deletions and modifications to the disclosed subject matter that fall within the meaning and scopes of the claims are to be embraced by the claims.

What is claimed:

1. A method for manufacturing an electronic device in a production line, comprising the steps of:
    electrically coupling and physically securing at least one surface mount device (SMD) on a printed circuit board (PCB) to form an electronic subassembly at a surface mount technology (SMT) station in the production line;
    applying a moisture-resistant protective coating to at least one portion of the electronic subassembly at a coating station in the production line;
    applying a second moisture-resistant protective coating, to a different portion of the electronic subassembly than the at least one portion, at a second coating station in the production line; and
    assembling electronic parts, user interface components, and housing components with the electronic subassembly at an assembly station in the production line.

2. The method of claim 1, wherein electrically coupling the SMD to the PCB comprises soldering the SMD to the PCB.

3. The method of claim 1, wherein said moisture-resistant protective coating comprises a poly(p-xylylene) polymer.

4. The method of claim 1, further comprising applying a moisture-resistant protective coating on at least a portion of the at least one SMD at another coating station in the production line prior to electrically coupling and physically securing the SMD to the PCB.

5. The method of claim 1, further comprising masking areas of the electronic subassembly where the moisture-resistant protective coating is not desired prior to applying the moisture-resistant protective coating at a masking station in the production line.

6. The method of claim 1, wherein the coating station comprises an apparatus for depositing a polymer coating, a molecular vapor diffusion apparatus, or a deposition apparatus for forming reactive species that polymerize on the electronic subassembly.

7. The method of claim 6, wherein the deposition apparatus is configured to vaporize at least one type of [2,2] paracyclophane, to pyrolyze the [2,2] paracyclophane to form p-xylylene intermediates and to enable the p-xylylene intermediates to polymerize on the electronic subassembly to form a poly(p-xylylene) polymer on the electronic subassembly.

8. The method of claim 1, further comprising treating a surface of the electronic subassembly for enhanced adhesion of the moisture-resistant protective coating prior to applying a moisture-resistant protective coating at a pre-coating station in the production line.

9. The method of claim 1, further comprising inspecting the electronic subassembly after it has been coated with the moisture-resistant protective coating at an inspection station in the production line.

10. The method of claim 1, further comprising selectively removing a portion of the moisture-resistant protective coating on the electronic subassembly at a material removal station in the production line.

* * * * *